US012791953B2

(12) United States Patent
Hong et al.

(10) Patent No.: US 12,791,953 B2
(45) Date of Patent: Nov. 10, 2026

(54) HOME PORT WITH PRESSURE-CONTROLLED CLEANING LIQUID FLOW AND SUBSTRATE TREATMENT APPARATUS

(71) Applicant: SEMES CO., LTD., Cheonan-si (KR)

(72) Inventors: Nam Ki Hong, Cheonan-si (KR); Ick Kyun Kim, Osan-si (KR); Jae Wook Lee, Osan-si (KR); Seung Kyu Park, Hwaseong-si (KR); Tae Won Yun, Namwon-si (KR); Si Hwan Yang, Osan-si (KR)

(73) Assignee: SEMES CO., LTD., Cheonan-si (KR)

( * ) Notice: Subject to any disclaimer, the term of this patent is extended or adjusted under 35 U.S.C. 154(b) by 781 days.

(21) Appl. No.: 18/139,381

(22) Filed: Apr. 26, 2023

(65) Prior Publication Data

US 2024/0160119 A1 May 16, 2024

(30) Foreign Application Priority Data

Nov. 14, 2022 (KR) ........................ 10-2022-0151372

(51) Int. Cl.

| | |
|---|---|
| ***B05B 15/55*** | (2018.01) |
| ***B05B 1/16*** | (2006.01) |
| ***B05B 1/30*** | (2006.01) |
| ***B05B 15/555*** | (2018.01) |

(Continued)

(52) U.S. Cl.

CPC ............ *G03F 7/70925* (2013.01); *B05B 1/16* (2013.01); *B05B 1/30* (2013.01); *B05B 15/55* (2018.02); *B05B 15/555* (2018.02); *G03F 7/70808* (2013.01); *H10P 72/0414* (2026.01)

(58) Field of Classification Search

CPC .................................................... B05B 15/555

See application file for complete search history.

(56) References Cited

U.S. PATENT DOCUMENTS 5,849,084 A * 12/1998 Hayes .................... G03F 7/422 118/302
6,170,494 B1 * 1/2001 Marinaro ................ B05B 15/55 134/25.4

(Continued)

FOREIGN PATENT DOCUMENTS

JP 2003332287 A 11/2003
JP 2010082582 A 4/2010

(Continued)

*Primary Examiner* — Karl Kurple
(74) *Attorney, Agent, or Firm* — Muir Patent Law, PLLC

(57) ABSTRACT

A home port for a semiconductor manufacturing nozzle head includes a body having a discharge space configured to receive treatment liquid discharged from a plurality of nozzles, discharge flow passages connected to be in communication with the discharge space and penetrating through the body so as to face the plurality of nozzles, and a cleaning liquid distribution system, which is formed to penetrate through the body, and is connected to transfer a cleaning liquid to the discharge flow passages. The cleaning liquid distribution system includes supply flow passages connected to supply the cleaning liquid to the discharge flow passages, and a lead-in passage connected to and which joins the supply flow passages, and connected to receive the cleaning liquid injected from the outside.

19 Claims, 10 Drawing Sheets

200

(51) Int. Cl.
*G03F 7/00* (2006.01)
*H10P 72/00* (2026.01)

(56) References Cited

U.S. PATENT DOCUMENTS 6,418,946 B1 * 7/2002 Marinaro .............. B05B 15/555 134/25.4
9,408,351 B2 * 8/2016 Riggs .................... B05B 15/658
11,331,921 B2 * 5/2022 Provenaz .............. B05B 15/555
12,230,510 B2 * 2/2025 Choi ....................... H10P 14/68
2010/0051059 A1 * 3/2010 Kometani ................. B08B 9/00 134/21
2015/0165458 A1 * 6/2015 Funakoshi ................ B05B 9/03 118/302
2016/0025254 A1 * 1/2016 Riggs .................... B05B 15/658 239/104
2017/0128962 A1 * 5/2017 Kashiyama ............... B05B 3/02
2018/0029059 A1 * 2/2018 Takahashi ............... B05B 12/02
2020/0035518 A1 * 1/2020 Miyagi ............... H10P 72/0414
2020/0324549 A1 * 10/2020 Provenaz ................ B05B 12/04
2023/0173526 A1 * 6/2023 Son ......................... B05B 16/80
2023/0201865 A1 * 6/2023 Moon ................. B05C 11/1039 118/300
2024/0173727 A1 * 5/2024 Alcaide Hernández ..................... B05B 12/004
2024/0198393 A1 * 6/2024 Kwak ....................... B08B 3/08
2025/0091077 A1 * 3/2025 Kang ...................... B05B 14/00
2025/0121395 A1 * 4/2025 Berndt ...................... F26B 3/02

FOREIGN PATENT DOCUMENTS

KR 10-2014-0084735 A 7/2014
KR 10-2022-0003966 A 1/2022
KR 10-2022-0017573 A 2/2022

* cited by examiner

[FIG. 1]
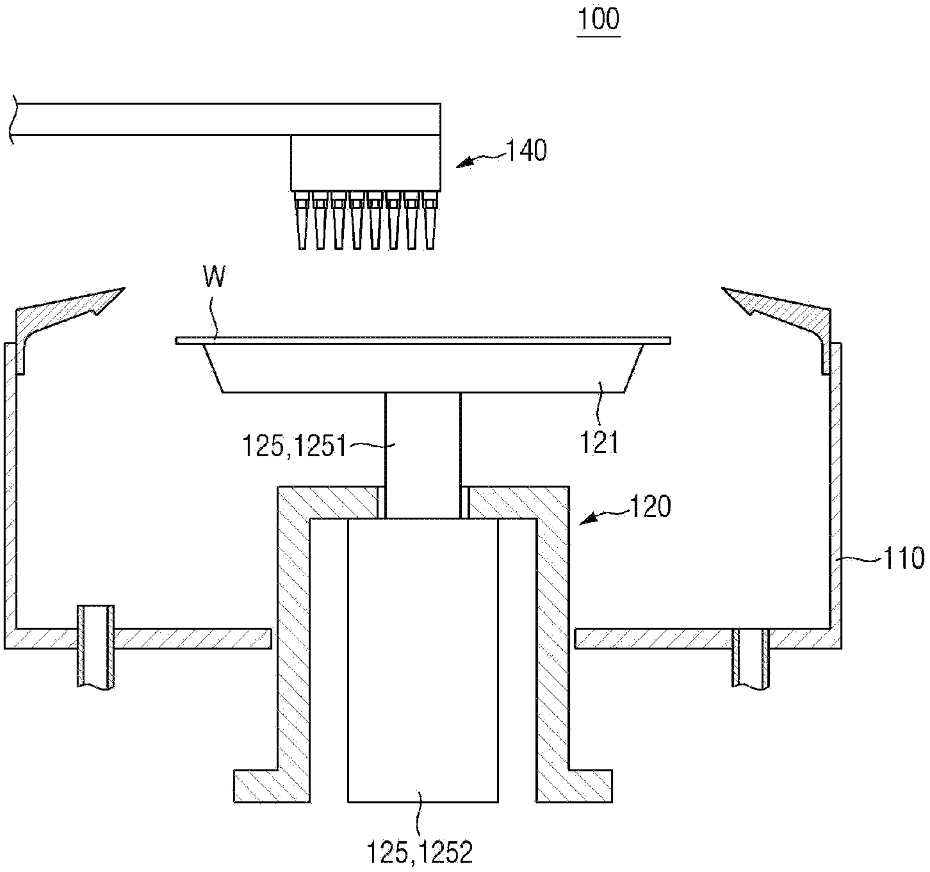

[FIG. 2]
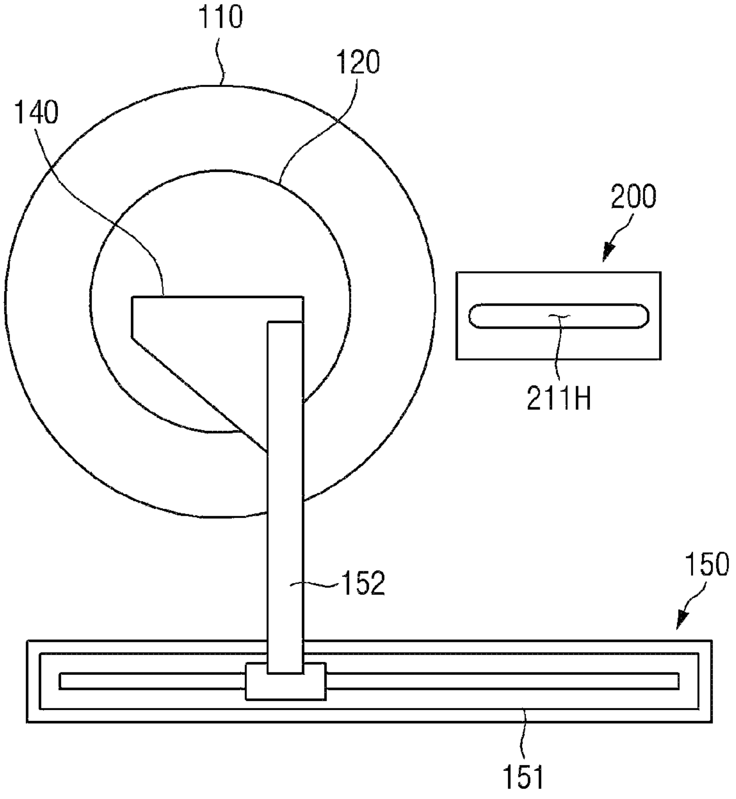

[FIG. 3]
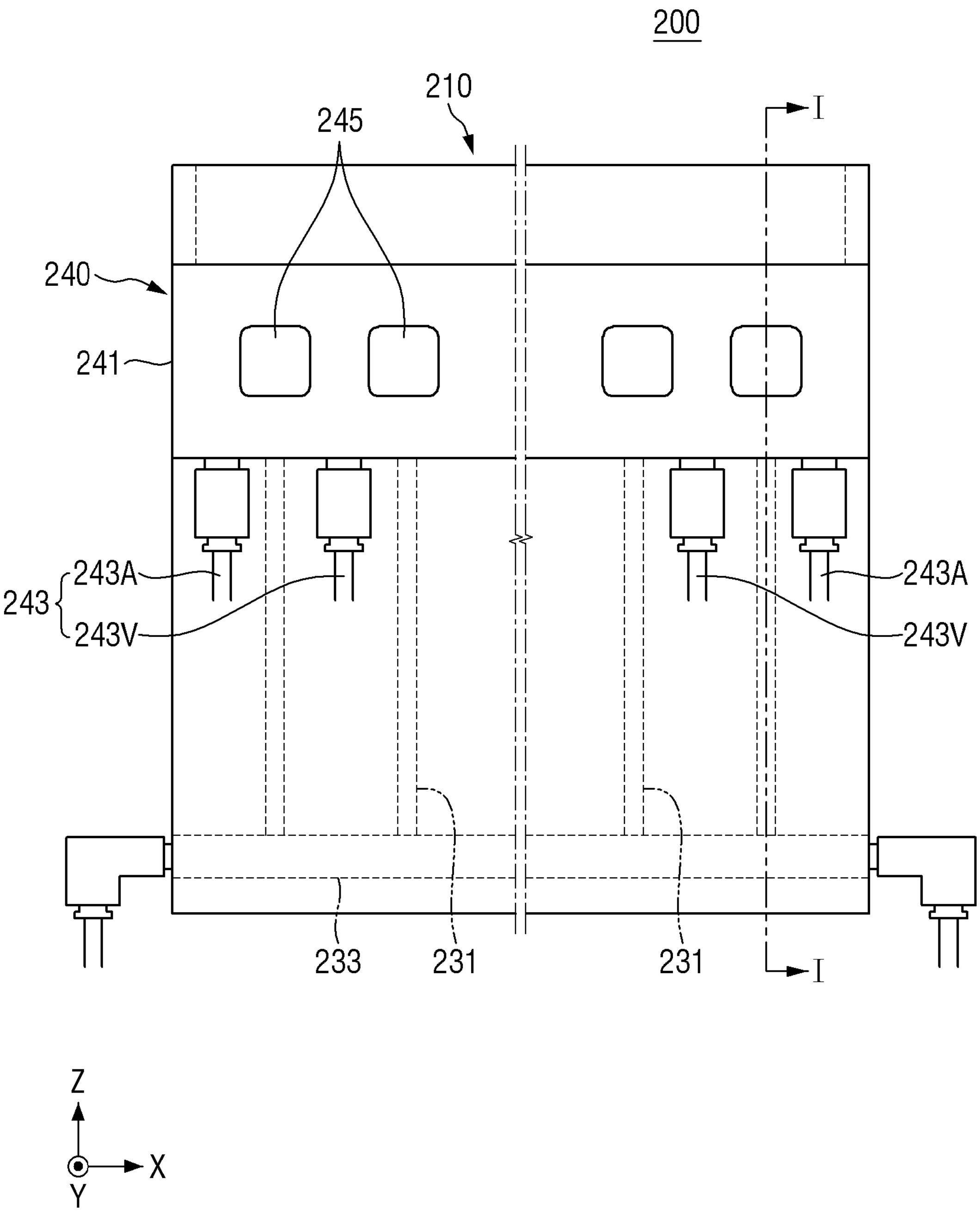

[FIG. 4]
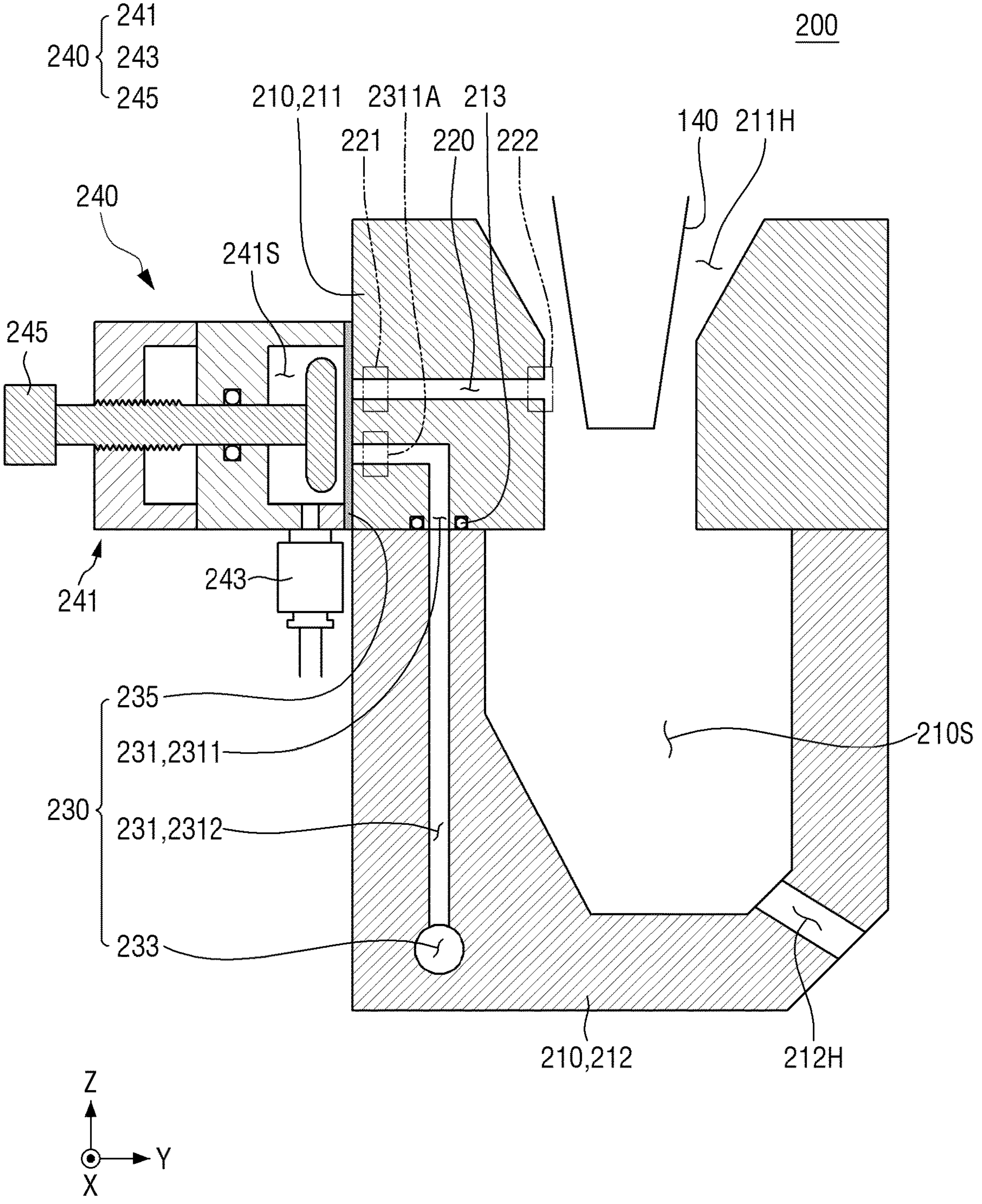

[FIG. 5]
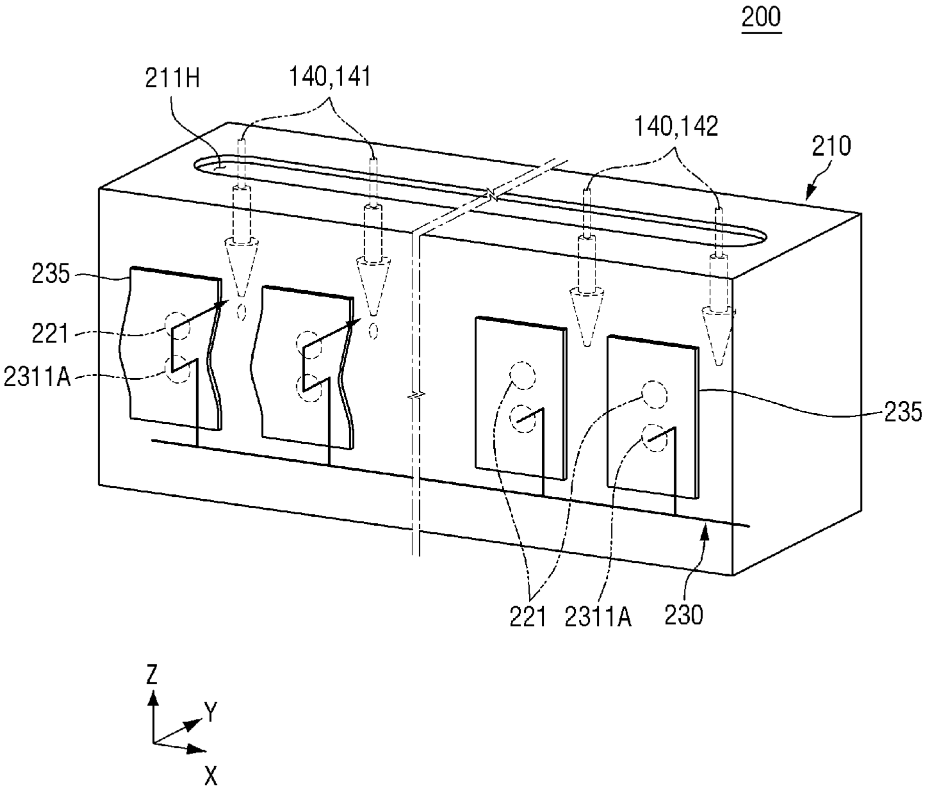

[FIG. 6]
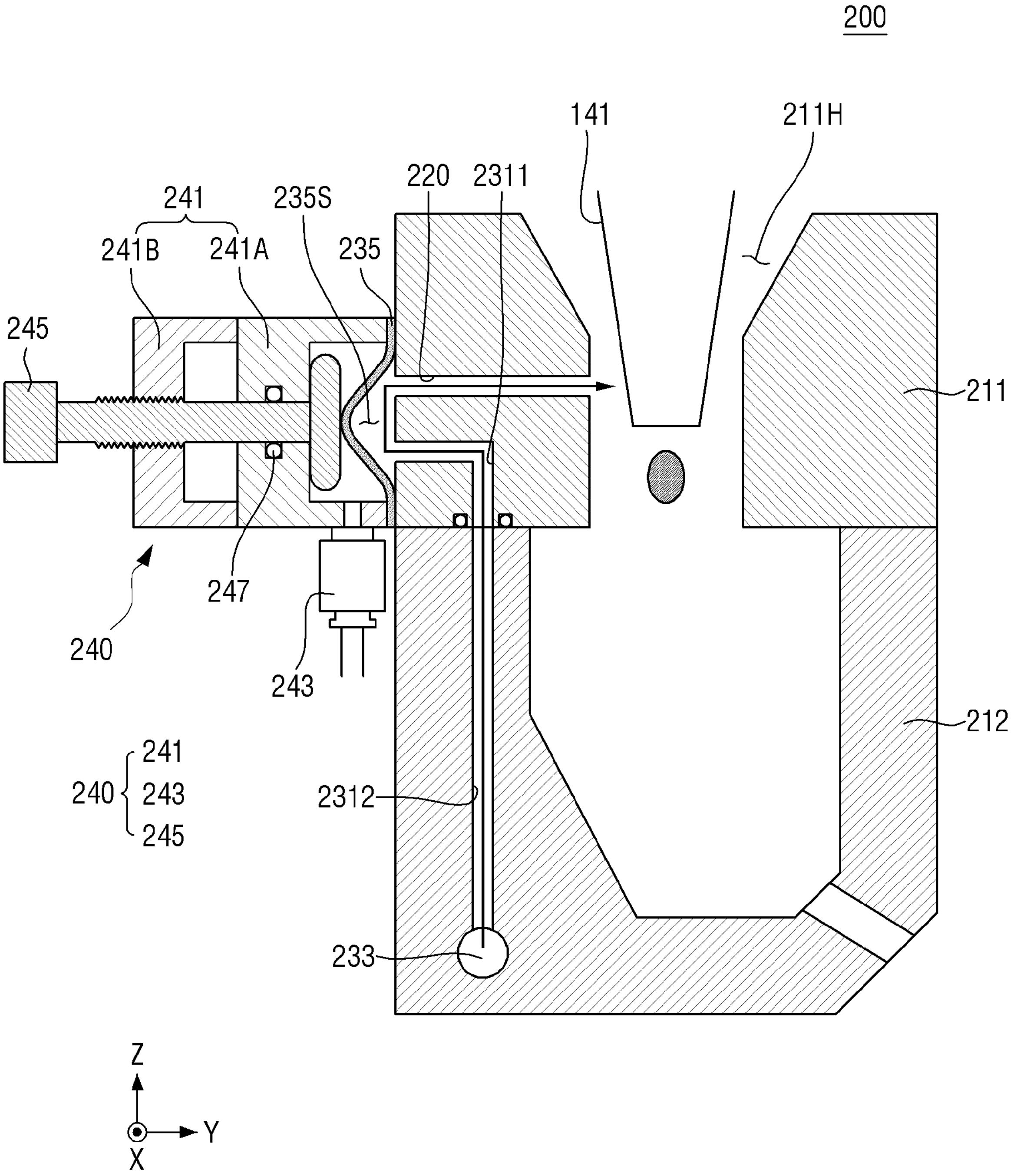

[FIG. 7]
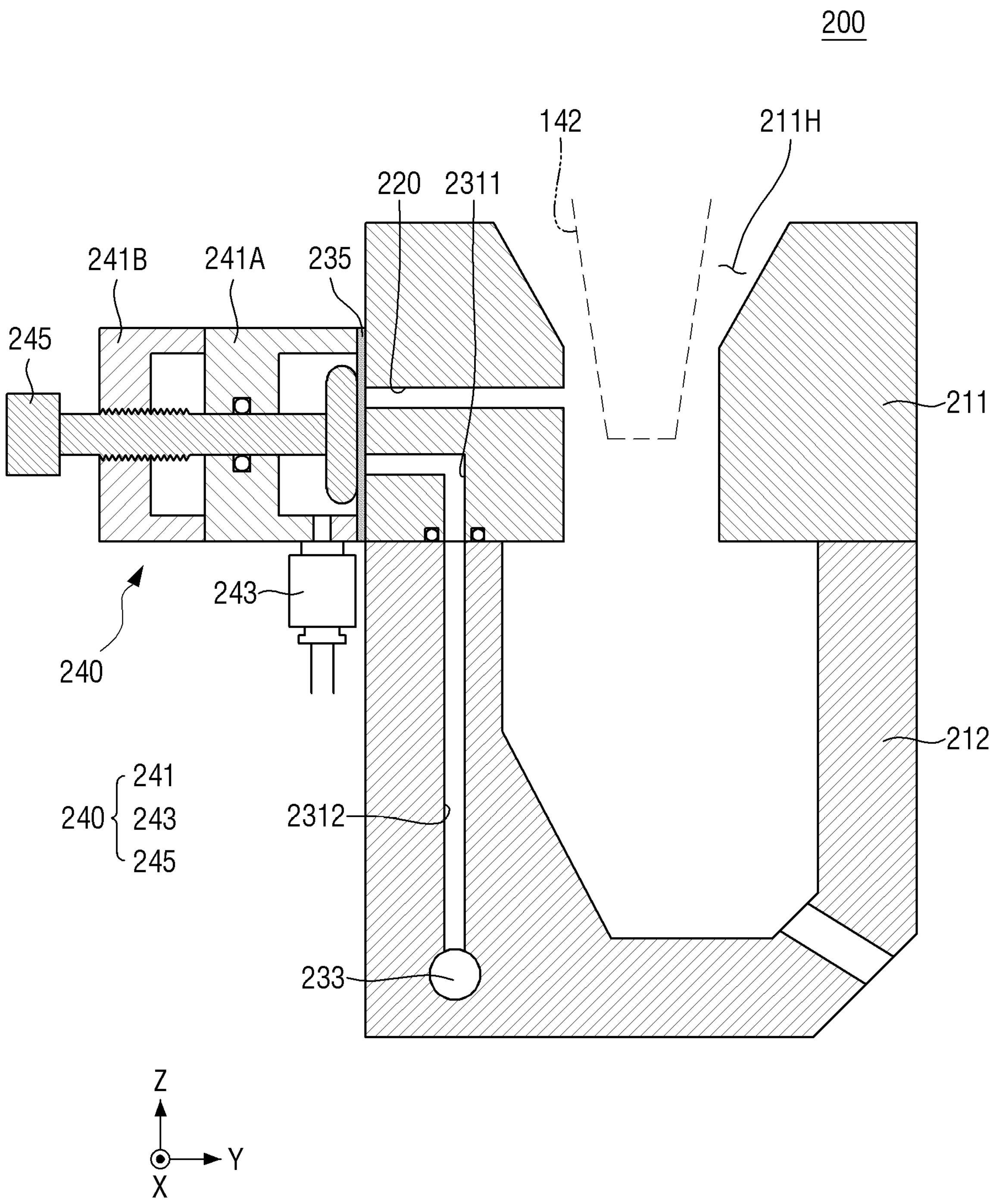

[FIG. 8]
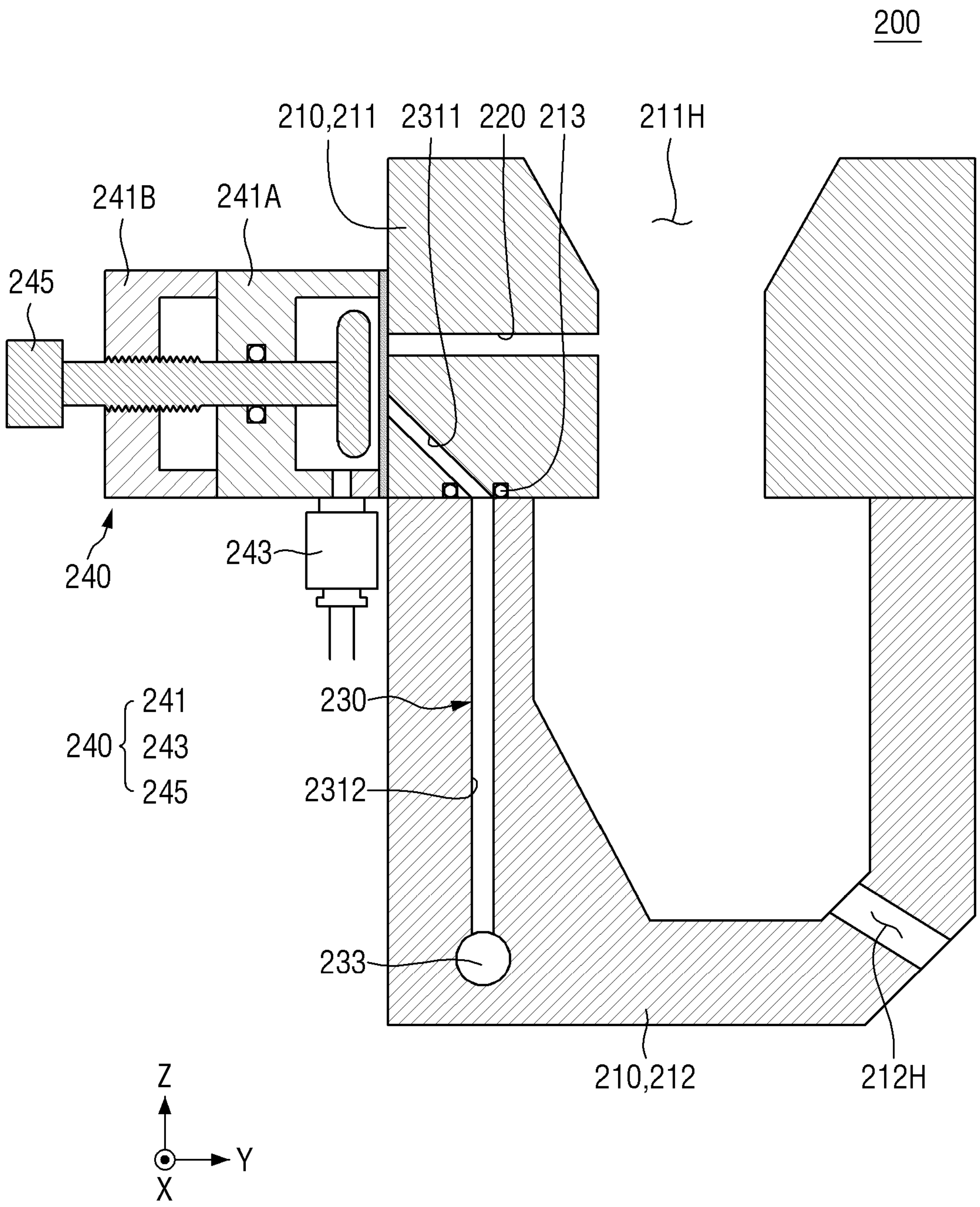

[FIG. 9]
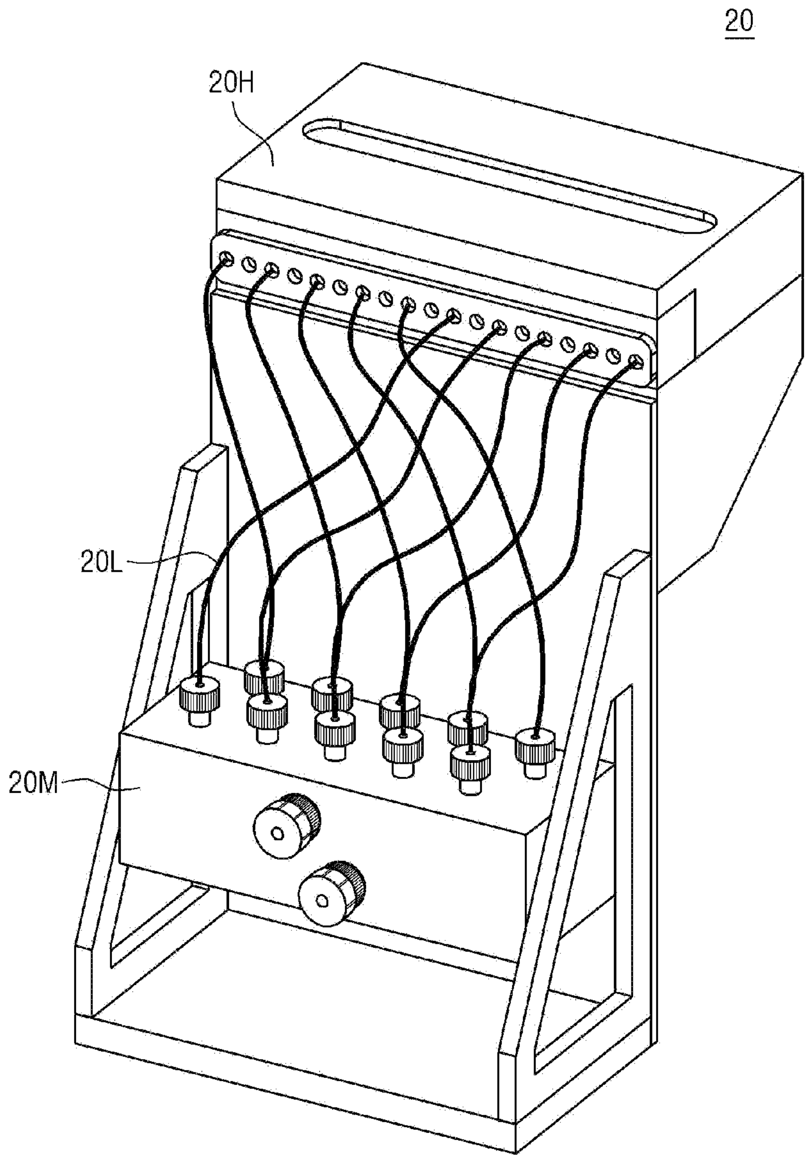

[FIG. 10]
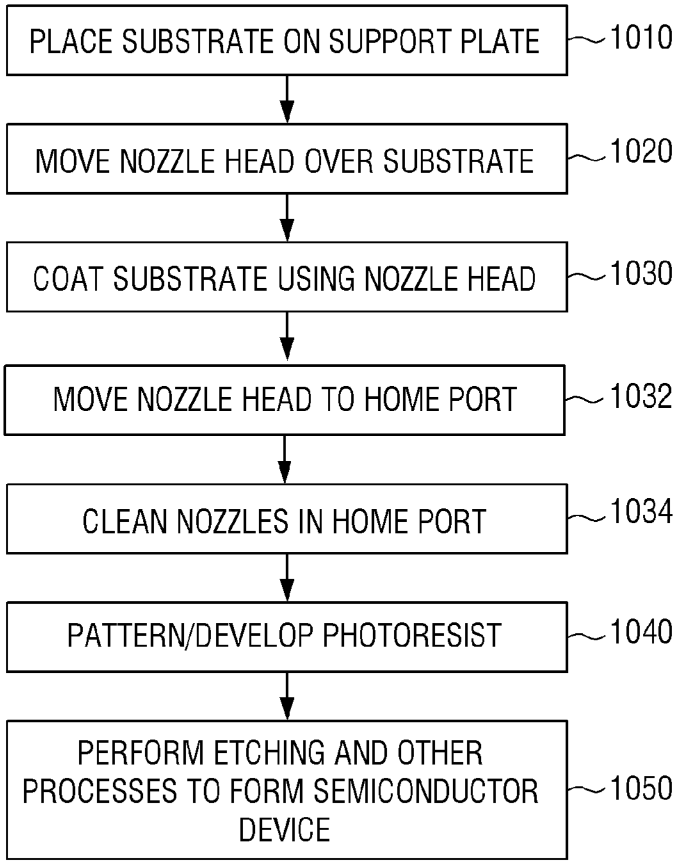

HOME PORT WITH PRESSURE-CONTROLLED CLEANING LIQUID FLOW AND SUBSTRATE TREATMENT APPARATUS

CROSS-REFERENCE TO RELATED APPLICATION

This application claims priority to Korean Patent Application No. 10-2022-0151372 filed on Nov. 14, 2022 in the Korean Intellectual Property Office, and all the benefits accruing therefrom under 35 U.S.C. 119, the contents of which application in its entirety are herein incorporated by reference.

BACKGROUND

1. Technical Field

The present disclosure relates to a home port and a substrate treatment apparatus including the same.

2. Description of the Related Art

A photo-lithography process among semiconductor fabricating processes is a process of forming a desired pattern on a wafer. The photo-lithography process may be performed in a spinner local facility connected to an exposing facility to continuously perform a coating process, an exposing process, and a developing process. The spinner local facility may sequentially or selectively perform a hexamethyl disilazane (HMDS) process, the coating process, a baking process, and the developing process.

A substrate treatment apparatus that treats the substrate by supplying a liquid such as a coating liquid and a developing liquid onto the substrate in the coating process or the developing process includes a nozzle discharging the liquid onto the substrate and a home port in which the nozzle periodically discharges the liquid while waiting in order to prevent contamination of the liquid that may occur when the liquid is stagnant in the nozzle for a long time.

SUMMARY

For proper substrate treatment, foreign substances around the nozzle should be removed in order to prevent contamination of a substrate. To this end, a cleaning liquid may be discharged from the home port. A manifold may be coupled to the home port so that the cleaning liquid is supplied. However, a space for installing the manifold is typically needed, and there is a risk of leakage of the cleaning fluid due to tearing (or bending) of a hose connecting the home port and the manifold to each other. In addition, a connection structure of the manifold is complicated, such that the number of assembly points is increased and it is not easy to control a flow rate, and the cleaning liquid is discharged even to unused nozzles of a plurality of nozzles, such that the cleaning liquid may be wasted. Accordingly, improvement of the home port is desired.

Aspects of the present disclosure provide a home port in which a cleaning liquid supply structure may be improved, and a substrate treatment apparatus including the same.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to an aspect of the present disclosure, a home port for a semiconductor manufacturing nozzle head includes a body having a discharge space configured to receive treatment liquid discharged from a plurality of nozzles, discharge flow passages connected to be in communication with the discharge space and penetrating through the body so as to face the plurality of nozzles, and a cleaning liquid distribution system, which is formed to penetrate through the body, and is connected to transfer a cleaning liquid to the discharge flow passages. The cleaning liquid distribution system includes supply flow passages connected to supply the cleaning liquid to the discharge flow passages, and a lead-in passage connected to and which joins the supply flow passages, and connected to receive the cleaning liquid injected from the outside.

According to an aspect of the present disclosure, a substrate treatment apparatus includes a substrate support for supporting a substrate, a nozzle head including a plurality of nozzles configured to discharge a treatment liquid, and a home port configured to receive the nozzle head. The home port includes a body including a first part in which the plurality of nozzles are positioned when received, and a second part coupled to the first part below the first part to form a discharge space configured to receive treatment liquid discharged from the plurality of nozzles; discharge flow passages penetrating through the first part of the body so that inlets thereof are formed at an outer side of the first part of the body and outlets thereof face the nozzles when positioned within the first part of the body; supply flow passages which penetrate through the body and are connected to transfer a cleaning liquid to the discharge flow passages; a lead-in passage which penetrates through the second part and joins the supply flow passages and is connected to receive the cleaning liquid injected from the outside; and valves surrounding the supply flow passages together with the inlets of the discharge flow passages to form adjustment spaces between the valves and the first part of the body, the adjustment spaces allowing the supply flow passages and discharge flow passages to communicate with each other outside the first part of the body.

According to another aspect of the present disclosure, a home port includes: a body including a first part configured to receive and house a plurality of nozzles and a second part coupled to the first part below the first part to form a discharge space configured to receive treatment liquid discharged from the nozzles, the second part having a drain hole positioned and through which to drain the treatment liquid; discharge flow passages penetrating through the first part of the body so that inlets thereof are formed at an outer side of the first part of the body and outlets thereof are positioned to face the nozzles when positioned within the first part of the body; supply flow passages which include first flow passages penetrating through the first part of the body and having first ends exposed to the outside of the first part of the body, and second flow passages communicating with the first flow passages and penetrating through the second part of the body and connected to transfer a cleaning liquid supplied to the discharge flow passages; a lead-in passage which penetrates through the second part and is connected to and joins the second flow passages and is connected to receive the cleaning liquid injected from the outside; valves surrounding the first ends of the first flow passages together with the inlets of the discharge flow passages and configured to form adjustment spaces between the valves and the first part of the body, the adjustment spaces allowing the supply flow passages and the first flow passages to communicate with each other outside the first part; and a housing having an operating space formed to be partitioned from the adjustment spaces while surrounding the valves on opposite sides to the adjustment spaces, and one or more pressure adjusting members configured to form a vacuum environment in the operating space or make a pressure of the operating space equal to or higher than that of the discharge space and including a vacuum line configured to form the vacuum environment in the operating space. For each valve, when the vacuum environment is formed in the operating space by a corresponding pressure adjusting member, a pressure is applied to the valve in a direction from the discharge space toward the operating space, such that the corresponding adjustment space is expanded and the inlet of the discharge flow passage and the first flow passage communicate with each other, and for each valve, when a pressure of the operating space is equal to or higher than that of the discharge space by a corresponding pressure adjusting member, the valve is restored, or when a pressure is applied to the valve in a direction from the operating space toward the discharge space, such that the valve abuts the first part of the body, the communication between the inlet of the discharge flow passage and the first flow passage is blocked.

BRIEF DESCRIPTION OF THE DRAWINGS

The above and other aspects and features of the present disclosure will become more apparent by describing in detail exemplary embodiments thereof with reference to the attached drawings, in which:

FIG. 1 is a cross-sectional view illustrating a substrate treatment apparatus according to some exemplary embodiments of the present disclosure;

FIG. 2 is a plan view illustrating the substrate treatment apparatus according to some exemplary embodiments of the present disclosure;

FIG. 3 is a view illustrating a home port according to a first exemplary embodiment of the present disclosure;

FIG. 4 is a cross-sectional view taken along line I-I of FIG. 3;

FIG. 5 is a view illustrating a flow of a cleaning liquid in the home port according to a first exemplary embodiment of the present disclosure;

FIG. 6 is a view illustrating a form in which the home port according to a first exemplary embodiment of the present disclosure discharges a cleaning liquid to a first nozzle;

FIG. 7 is a view illustrating a form in which the home port according to a first exemplary embodiment of the present disclosure does not discharge a cleaning liquid to a second nozzle;

FIG. 8 is a view illustrating a home port according to a second exemplary embodiment of the present disclosure;

FIG. 9 is a view illustrating a home port according to a comparative example; and FIG. 10 is an example method of manufacturing a semiconductor device according to an exemplary embodiment.

DETAILED DESCRIPTION OF THE EMBODIMENTS

Hereinafter, exemplary embodiments of the present disclosure will be described in detail with reference to the accompanying drawings. Advantages and features of the present disclosure and methods for accomplishing these advantages and features will become apparent from exemplary embodiments to be described later in detail with reference to the accompanying drawings. However, the present disclosure is not limited to exemplary embodiments to be disclosed below, but may be implemented in various different forms, these exemplary embodiments will be provided only in order to make the present disclosure complete and allow one of ordinary skill in the art to which the present disclosure pertains to completely recognize the scope of the present disclosure, and the invention will be defined by the scope of the claims. Throughout the specification, the same components will be denoted by the same reference numerals.

The terms as used herein are for describing exemplary embodiments rather than limiting the present disclosure. In the present specification, a singular form includes a plural form unless stated or indicated otherwise. Components, steps, operations, and/or elements mentioned by the terms "comprise" and/or "comprising" as used herein do not exclude the existence or addition of one or more other components, steps, operations, and/or elements.

FIG. 1 is a cross-sectional view illustrating a substrate treatment apparatus according to some exemplary embodiments of the present disclosure, and FIG. 2 is a plan view illustrating the substrate treatment apparatus according to some exemplary embodiments of the present disclosure.

Referring to FIGS. 1 and 2, an apparatus 100 for treating a substrate according to an exemplary embodiment of the present disclosure may include a cup body 110, a substrate support 120, a nozzle head 140, and a home port 200. A treatment liquid to be mentioned below may be a photosensitive liquid such as a photoresist, and a cleaning liquid to be mentioned below may be a thinner, but the present disclosure is not limited thereto.

The cup body 110, substrate support 120, and nozzle head 140 may be used for treating a substrate, for example for photolithography by supplying a liquid such as a coating liquid and a developing liquid onto the substrate in the coating process or the developing process. The cup body 110 is a component in which the treatment liquid is recovered, and may be provided in a structure in which it surrounds a circumference of the substrate support 120. The cup body 110 may be provided in a cylindrical shape with an open top. The cup body 110 may also be described as a cylinder. An exhaust line (not illustrated) draining the treatment liquid to the outside may be formed in the cup body 110.

The substrate support 120 may support and rotate a substrate W within the cup body 110. The substrate support 120 may include a support plate 121 and a driving member 125 (e.g., driver). Pins (not illustrated) supporting the substrate W may be provided on an upper surface of the support plate 121.

The support plate 121 is rotatable by the driving member 125. The support plate 121 may be a platform or stage for supporting a substrate, and may be described as a substrate support platform or stage. The driving member 125 may include a driving shaft 1251 and an actuator 1252. The driving shaft 1251 may be coupled to a lower surface of the support plate 121. The actuator 1252 may provide a torque to the driving shaft 1251 and may be a motor.

The nozzle head 140 may discharge the treatment liquid onto the substrate W. The nozzle head 140 may include a plurality of nozzles 141 and 142 (see, e.g., FIG. 5). Treatment liquid supply lines (not illustrated) may be individually connected to the plurality of nozzles 141 and 142, respectively, so that the plurality of nozzles 141 and 142 individually discharge the treatment liquids. For example, the treatment liquid supply lines may pass through a connection arm or tube connected to a nozzle base that houses the plurality of nozzles 141 and 142 to form the nozzle head. However, the present disclosure is not limited thereto.

The nozzle head 140 may discharge the treatment liquid in the home port 200 so that the treatment liquid does not stick to the nozzles. However, according to a process, some nozzles 141 of the plurality of nozzles 141 and 142 may treat the substrate W, and the other nozzles 142 of the plurality of nozzles 141 and 142 may not treat the substrate W and thus, may not discharge the treatment liquid in a process time and a waiting time (see FIG. 5).

For example, the nozzle head 140 may include first nozzles 141 (e.g., a first set of nozzles) and second nozzles 142 (e.g., a second set of nozzles). See, e.g., FIG. 5.

The first nozzles 141 may need to be cleaned because they treat the substrate W, and the second nozzles 142 may not need to be cleaned because they do not treat the substrate W. For example, the first nozzles 141 may need to be cleaned because they may be contaminated due to the discharge of the treatment liquid. Accordingly, the first nozzles 141 may be cleaned by a cleaning liquid discharged from the home port 200 while waiting in the home port 200. The second nozzles 142 may be provided as dummy nozzles or preliminary nozzles that need not to be cleaned because they do not treat the substrate W. Accordingly, cleaning of the second nozzles 142 by a cleaning liquid may be omitted while the second nozzles 142 wait in the home port 200. Cleaning of the nozzle head 140 will be described later.

The nozzle head 140 may be moved to a process position and a waiting position by a nozzle moving member 150. The process position is a position at which the nozzle head 140 faces the substrate W put on the support plate 121. The waiting position is a position at which the nozzle unit 140 waits (e.g., is housed) in the home port 200.

The nozzle moving member 150 may include a guide rail 151, an arm 152, and a driving member (not illustrated).

The guide rail 151 may be positioned adjacent to the cup body 110. The guide rail 151 may have a length to extend between the process position and the waiting position. The arm 152 may be installed on the guide rail 151.

The arm 152 may have a bar shape, but is not limited thereto. One end of the arm 152 may be installed on the guide rail 151 to be moveably connected to the guide rail 151, and the nozzle head 140 may be detachably provided at the other end of the arm 152.

The driving member may be a motor and may provide a driving force to the guide rail 151 to reciprocate the arm 152 and the nozzle head 140 between the process position and the waiting position.

The nozzle head 140 may wait in the home port 200. The nozzle head 140 waiting in the home port 200 may continuously or intermittently discharge the treatment liquid. The home port 200 may drain the treatment liquid discharged from the nozzle head 140 to the outside. The home port 200 may be positioned adjacent to the cup body 110. A control system (not shown) may be used to control the position of the nozzle head 140 based on control instructions. For example, the control system may include hardware and software configured to carry out various tasks such as moving the nozzle head 140 between the process position and the waiting position, controlling the discharging of the treatment liquid, and other tasks. Hereinafter, the home port 200 will be described with reference to the drawings. The home port may be a nozzle holding container, station, or chamber, or a nozzle cleaning container, station, or chamber, and may be further described as a semiconductor manufacturing nozzle home station.

FIGS. 3 and 4 are views illustrating a home port according to a first exemplary embodiment of the present disclosure. In addition, FIG. 5 is a view illustrating a flow of a cleaning liquid in the home port according to a first exemplary embodiment of the present disclosure. FIGS. 6 and 7 are views illustrating a form in which the home port according to a first exemplary embodiment of the present disclosure discharges a cleaning liquid and a form in which the home port according to a first exemplary embodiment of the present disclosure does not discharge a cleaning liquid, respectively.

Referring to FIGS. 3 to 7, the home port 200 may include a body 210, discharge flow passages 220, a cleaning liquid distribution part 230, and a controller 240.

The body 210 may have a discharge space 210S in which the nozzle head 140 discharges the treatment liquid. As an example, the body 210 may have a rectangular box structure, and may include a first part 211 and a second part 212 coupled to each other in a vertical direction.

The first part 211 is an upper structure, also described as an upper housing or upper compartment, and the nozzle head 140 may be positioned or housed in the first part 211. The first part 211 has an opening 211H formed therein, such that the nozzle head 140 may be inserted into the first part 211. The opening 211H may be formed as an elongated hole so that the plurality of nozzles 141 and 142 may be simultaneously inserted therein (see FIG. 5). For example, the plurality of nozzles 141 and 142 may be arranged in a row extending in a first direction (e.g., the X direction), and the opening 211H may extend lengthwise in the same direction as the row. However, the present disclosure is not limited thereto.

The first part 211 may be made of a metal such as aluminum, and an inner circumferential surface of the first part 211 facing the discharge space 210S may be coated with a non-conductor material such as Teflon. For example, the first part 211 may be made of the metal in order to be grounded.

For example, when the first part 211 is made of a resin, similar to the second part 212, static electricity may be generated. The static electricity may attract the treatment liquid discharged from the first nozzle 141 toward the first part 211. When the treatment liquid is attracted toward the first part 211 to collide with the first part 211, the treatment liquid is bounced from the first part 211 to the nozzle head 140, such that there is a risk that the nozzle head 140 will be contaminated. Accordingly, in order to prevent the generation of the static electricity, the first part 211 may be made of the metal and may be in a ground state (e.g., electrically connected to a ground, for example through a metal connection such as a wire).

The second part 212, also described as a lower housing or lower compartment, is a lower structure and may be coupled to the first part 211 below the first part 211 to form the discharge space 210S. A drain hole 212H may be formed in the second part 212. The drain hole 212H may be positioned at a lower portion of the second part 212. The second part 212 may be made of a resin so that a problem such as corrosion does not occur.

The discharge flow passages 220 are components discharging a cleaning liquid, and may communicate with the discharge space 210S and penetrate through the body 210 so as to face the plurality of nozzles 141 and 142. Though only one discharge flow passage 220 is shown in FIG. 4, a plurality may be formed to be arranged in a row in the X direction.

For example, the discharge flow passages 220 may penetrate through the first part 211 so that inlets 221 thereof are formed at an outer side of the first part 211 and outlets 222 thereof are positioned in the discharge space 210S. In some embodiments, the region where the cleaning liquid is discharged from the discharge flow passages 220 (e.g., just above a bottom of the nozzles 141 and 142 when inserted into the opening 211H) may be part of the discharge space 210S. The discharge flow passages 220 may penetrate through the first part 211 in a horizontal direction, but are not limited thereto. The discharge flow passages 220 may also be described as discharge flow openings or discharge flow paths.

The discharge flow passages 220 may be configured to discharge the cleaning liquid to the first nozzles 141 and to not discharge the cleaning liquid to the second nozzles 142. For example, the controller 240 may control or may be used to control whether or not the discharge flow passages 220 discharge the cleaning liquid.

A number of discharge flow passages 220 corresponding to the sum of the number of first nozzles 141 and the number of second nozzles 142 may be provided so that the discharge flow passages 220 are provided in a form in which they may clean all of the plurality of nozzles 141 and 142. In addition, the same number of discharge flow passages 220 as the number of supply flow passages 231 and the number of gap adjusting members 245 may be provided.

The cleaning liquid distribution part 230 may distribute the cleaning liquid so as to perform a manifold function. The cleaning liquid distribution part 230 may be formed to penetrate through the body 210, and the cleaning liquid supplied to the discharge flow passages 220 may pass through the cleaning liquid distribution part 230.

For example, the cleaning liquid distribution part 230, also described as a cleaning liquid distribution system, may include supply flow passages 231, a lead-in passage 233, and valves 235.

The supply flow passages 231, which may be supply flow openings or paths, may supply the cleaning liquid to the discharge flow passages 220. Each of the supply flow passages 231 may include a first flow passage 2311 and a second flow passage 2312.

The first flow passage 2311 may penetrate through the first part 211, and may have one end 2311A exposed to the outside of the first part 211. The first flow passage 2311 faces the second flow passage 2312, such that a straight line section may be formed in the vertical direction. The first flow passage 2311 may have a bent or curved shape so as to penetrate through the first part 211 from a bottom of the first part toward a sidewall of the first part. However, the present disclosure is not limited thereto, and another example will be described with reference to FIG. 8.

A first O-ring 213 surrounding a straight line section of the first flow passage 2311 between the first part 211 and the second part 212 may be provided for sealing. The various passages described above and below may be formed simply openings in the material that forms the upper structure 211 and lower structure 212, or may be formed with a separate material or component formed in those openings, such as a coating, tube, or pipe. The openings may be tubular openings having round, cylindrical, elongated shapes, for example (some of which may have a bent or curved section, such as depicted in the first flow passage 2311).

The second flow passage 2312 may communicate with the first flow passage 2311, penetrate through the second part 212, and join the lead-in passage 233. For example, the second flow passage 2312 may vertically penetrate through the second part 212 in a downward direction (e.g., Z direction) from an upper end of the second part 212. A lower portion of the second flow passage 2312 joins the lead-in passage 233, such that a plurality of second flow passages 2312 may receive the cleaning liquid through the lead-in passage 233.

The lead-in passage 233, also described as supply source passage 233, may penetrate through the second part 212 and join the supply flow passages 231, and the cleaning liquid from a supply source may be injected from the outside to the lead-in passage 233. For example, the lead-in passage 233 may completely penetrate through the second part 212 from one sidewall of the second part 212 to the other sidewall thereof, extending in the X direction) so that the cleaning liquid may be injected from both ends of the second part 212 to the lead-in passage 233 (see FIG. 3).

However, the present disclosure is not limited thereto, and the lead-in passage 233 may also have a structure in which only one end thereof is exposed to the outside and the other end thereof extends only to an area in which a final supply flow passage of a plurality of supply flow passages 231 is positioned. That is, various modified examples such as an example in which the lead-in passage 233 has a structure in which the cleaning liquid is injected from only one end of the second part 212 rather than both ends of the second part 212 are possible.

The valve 235 may surround or cover the inlet 221 of the discharge flow passage 220 and one end 2311A of the first flow passage 2311 to form an adjustment space 235S between the valve 235 and the first part 211 (see FIG. 6).

The valve 235, which may be an opening and closing part such as membrane, may function as a switch, may be a diaphragm, and may be made, for example, of a flexible and sealing material such as Teflon. For example, the valve 235 may have a plate shape such as a rectangle having elasticity or made of a flexible material so that it becomes convex toward the operating space 241S or its shape is restored. However, even though the adjustment space 235S is expanded, as shown in FIG. 4, the adjustment space 235S and an operating space 241S are always partitioned, such that the operating space 241S does not communicate with the adjustment space 235S. As an example, the valve 235 may be changed in shape only at a central portion thereof while all edges of four sides thereof are fixed to the first part 211 or fixed to a housing member 241.

When the valve 235 becomes convex, the adjustment space 235S may allow the supply flow passage 231 and the first flow passage 2311 to communicate with each other outside the first part 211. On the other hand, when the valve 235 is restored and flattened, the communication between the supply flow passage 231 and the first flow passage 2311 may be blocked. Thus, the valve 235 functions as a valve allowing fluid to flow from the second flow passage 2312 to the first flow passage 2311 when open, and blocking such flow when closed. The valve 235 may be described as a sealing sheet valve or flexible sheet valve.

The controller 240, also described as a valve controller or a control compartment, may include the housing 241, a pressure adjusting member 243, and the gap adjusting members 245.

The housing 241, also described as a controller housing, may be subjected to a vacuum environment and vacuum breakage for shaping of the valve 235 to be convexly changed or be restored. For example, the housing 241 may have the operating space 241S formed to surround the valve 235 on an opposite side to the adjustment space 235S, and whose volume is determined based on the state of the valve

235. A vacuum environment may be formed in the operating space 241S by the pressure adjusting member 243. To this end, the pressure adjusting member 243 may be installed in the housing 241. In addition, the gap adjusting member 245 may be installed in the housing 241.

As an example, the housing 241 may include a first member 241A, or first housing or housing portion, and a second member 241B, or second housing or housing portion. The first member 241A may have the operating space 241S formed therein and may have one side that is opened, and the valve 235 may be positioned on one side of the first member 241A. The gap adjusting member 245 may penetrate through the first member 241A, and a second O-ring 247 for sealing may be provided around the gap adjusting member 245. In addition, the second member 241B may be provided on the other side of the first member 241A, and through holes (not illustrated) through which the gap adjusting members 245 penetrate may be formed in the second member 241B. Screw threads with which the gap adjusting members 245 are engaged may be formed on inner circumferential surfaces of the through holes of the second member 241B.

The operating space 241S of the housing 241 may have a structure in which a plurality of valves 235 are provided in one space (e.g., one elongated space or compartment extending in the X direction). For example, the operating space 241S may not be partitioned, and may be provided so that the vacuum environment may be formed in the operating space 241S by one pressure adjusting member 243. This is to minimize the number of pressure adjusting members 243, but the present disclosure is not limited thereto.

The pressure adjusting member 243 may form the vacuum environment in the operating space 241S or may break the vacuum environment so that a pressure of the operating space 241S is equal to or higher than that of the discharge space 210S.

For example, the pressure adjusting member 243 may include a vacuum line 243V and an air supply line 243A. As an example, a shape change of the plurality of valves 235 is formed by the vacuum environment, but since the vacuum environment may be formed by one pressure adjusting member 243, the number of pressure adjusting members 243 may be less than the number of valves 235. The vacuum environment may refer to a state in which a suction pressure is applied through the vacuum line 243V to reduce the pressure inside the operating space 241S compared to the pressure inside the discharge space 210S and discharge flow passages 220.

As an example, a sum of the numbers of first nozzles 141 and second nozzles 142 may be eight, and each of the numbers of discharge flow passages 220 and valves 235 may be eight to correspond to each of the numbers of first nozzles 141 and second nozzles 142. On the other hand, the number of pressure adjusting members 243 may be one. However, the present disclosure is not limited thereto, and the number of pressure adjusting members 243 may also be two or more as illustrated in FIG. 3. The pressure adjusting member 243, whether including a single vacuum line and supply line or a plurality of vacuum lines and supply lines, may be generally referred to herein as a pressure adjusting system or pressure controller.

The vacuum line 243V may form the vacuum environment in the operating space 241S, and may be provided with a valve and a vacuum pump (not illustrated). The air supply line 243A may supply air (or compressed air) to the operating space 241S, and may have a vent structure or may be provided with a compressor (not illustrated). As used herein, "air" may refer to atmospheric air, or to other gases used for the purposes of creating additional pressure.

The gap adjusting member 245 is a component adjusting a volume of the adjustment space 235S, and may be engaged with the screw threads of the housing 241 (screw threads of the second member 241B) to adjust a distance to the valve 235 according to a position of screw coupling (see FIGS. 6 and 7).

For example, the gap adjusting member 245 may have a rod shape having screw threads formed on a circumferential surface thereof. For example, the gap adjusting member 245 may be a gap adjusting rod connected to the housing 241 using one or more adjustable and locking connectors. A thread and screw coupling may be used, as depicted in FIGS. 4 and 6-8, or other couplings may be used, for example, such as a spring loaded locking system. The gap adjusting member 245 may have a structure in which a handle is provided at a first end thereof exposed to the outside and a second, opposite end thereof positioned in the operating space 241S has an extended cross section (e.g., to have a flat surface facing a surface of the valve 235. The second end of the gap adjusting member 245 may have an area covering both the inlet 221 of the discharge flow passage 220 and one end 2311A of the first flow passage 2311.

The gap adjusting member 245 may adjust the volume of the adjustment space 235S by adjusting a height at which the valve 235 becomes convex.

For example, when the gap adjusting member 245 is positioned in a state in which it becomes farthest from the first part 211, the valve 235 may become most convex. In this case, the volume of the adjustment space 235S is maximized, such that a flow rate of the cleaning liquid passing through the adjustment space 235S may be maximized.

On the other hand, when the end of the gap adjusting member 245 abuts the first part 211 with only the valve 235 in between (e.g., arrives at a closest distance to an outer sidewall of the first part 211 with only the valve 235 therebetween), the valve 235 may have a flat plate shape regardless of the vacuum environment of the operating space 241S. In this case, the volume of the adjustment space 235S is minimized or eliminated, such that the cleaning liquid may not pass through the adjustment space 235S and the flexible sheet valve is closed.

In addition, since the gap adjusting member 245 may move between a position at which it becomes farthest from the first part 211 and a position at which it abuts the first part 211, the gap adjusting member 245 may adjust the volume of the adjustment space 235S according to the position. When the volume of the adjustment space 235S is adjusted, a supply flow rate of the cleaning liquid may be adjusted, and thus, a flow rate of the cleaning liquid may be individually adjusted according to viscosity of the treatment liquid discharged from the nozzle head 140, such that efficiency of cleaning of the nozzle head 140 may be improved.

As an example, the position of the gap adjusting member 245 may be adjusted so that an amount of the cleaning liquid is increased when the viscosity of the treatment liquid is high and is decreased when the viscosity of the treatment liquid is low.

Hereinafter, a flow of the cleaning liquid will be described with reference to the drawings.

The cleaning liquid may be supplied from the outside through the lead-in passage 233. The cleaning liquid flowing into the lead-in passage 233 may be distributed to a plurality of discharge flow passages 220 via the supply flow passages 231.

Referring to FIGS. 5 and 6, the pressure adjusting member 243 may form the vacuum environment in the operating space 241S. When the vacuum environment is formed in the operating space 241S, a pressure is applied to the valve 235 in a direction from the discharge space 210S toward the operating space 241S, such that the adjustment space 235S may be expanded. When the adjustment space 235S is expanded, the inlet 221 of the discharge flow passage 220 and the first flow passage 2311 may communicate with each other, such that the cleaning liquid may be supplied from the supply flow passage 231 to the discharge flow passage 220. In this case, the cleaning liquid may be discharged from the discharge flow passage 220 to the first nozzle 141.

On the other hand, when a pressure of the operating space 241S is equal to or higher than that of the discharge space 210S by the pressure adjusting member 243, the valve 235 is restored or a pressure is applied to the valve 235 in a direction from the operating space 241S toward the discharge space 210S, such that the valve 235 may contact the first part 211. In this case, a gap is not formed in the operating space 241S, such that the communication between the inlet 221 of the discharge flow passage 220 and the first flow passage 2311 may be blocked.

In this way, the cleaning liquid may be supplied or blocked by the pressure adjusting member 243.

Even in a state in which the operating space 241S becomes convex by the pressure adjusting member 243 and the cleaning liquid may be supplied, some of the plurality of discharge flow passages 220 may be supplied with the cleaning liquid, and the others of the plurality of discharge flow passages 220 may not be supplied with the cleaning liquid. This is because some of the plurality of nozzles 141 and 142 are not used according to a process.

As an example, the second nozzles 142 that are not used may not need to be cleaned because they do not discharge the treatment liquid, and accordingly, the cleaning liquid does not need to be discharged from the discharge flow passages 220 to the second nozzles 142 when the second nozzles 142 wait in the home port 200. A waste of the cleaning liquid may be prevented by allowing the plurality of discharge flow passages 220 to discharge the cleaning liquid to the first nozzles 141 but not to discharge the cleaning liquid to the second nozzles 142. Accordingly, some of the plurality of supply flow passages 231 distributing the cleaning liquid can be opened and the others of the plurality of supply flow passages 231 can be blocked. To this end, the gap adjusting members 245 may be set to be different from each other as follows.

Referring to FIGS. 5 and 6, some gap adjusting members 245 (which may face the first nozzles 141) corresponding to the first nozzles 141 among a plurality of gap adjusting members 245 may be positioned to be spaced apart from the first part 211 so as to allow expansion of the adjustment spaces 235S corresponding to positions of the first nozzles 141.

In this case, the cleaning liquid flowing into the lead-in passage 233 may be supplied to the plurality of discharge flow passages 220 via the supply flow passages 231 and the adjustment spaces 235S. The cleaning liquid supplied to the discharge flow passages 220 may be discharged from the discharge flow passages 220 to the first nozzles 141 to clean the first nozzles 141.

On the other hand, referring to FIGS. 5 and 7, the other gap adjusting members 245 (which may face the second nozzles 142) corresponding to the second nozzles 142 rather than the first nozzles among the plurality of gap adjusting members 245 allow the adjustment spaces 235S corresponding to positions of the second nozzles 142 to be shrunk, such that gaps may not be formed in the adjustment spaces 235S. That is, the gap adjusting members 245 are provided at positions at which they move the valves 235 and the first part 211 to abut each other, such that the communication between the inlets 221 of the discharge flow passages 220 and the first flow passages 2311 is blocked. Accordingly, even though the cleaning liquid flowing into the lead-in passage 233 is supplied to the supply flow passages 231, the cleaning liquid is blocked by the valves 235, such that a fluid flow may be blocked.

In this way, the cleaning liquid may be distributed inside the home port 200, a flow rate of the cleaning liquid may be adjusted, and the cleaning liquid may be discharged to clean only the first nozzles 141 of the plurality of nozzles 141 and 142.

Hereinafter, a modified example of the present exemplary embodiment will be described with reference to FIG. 8, and an overlapping description of the same components performing the same functions will be omitted.

FIG. 8 is a view illustrating a home port according to a second exemplary embodiment of the present disclosure. Contents different from those described with reference to FIGS. 2 to 7 will be mainly described with reference to FIG. 8.

Referring to FIG. 8, a home port 200 according to a second exemplary embodiment may include a body 210, discharge flow passages 220, a cleaning liquid distribution part 230, and a controller 240, like or similar to a first exemplary embodiment.

However, unlike a first exemplary embodiment, a first flow passage 2311 according to a second exemplary embodiment does not have a bent shape and is formed only in a straight line structure. As an example, the first flow passage 2311 penetrates through the first part 211, but may penetrate through the first part 211 in a form in which it is inclined from a lower end thereof facing the second flow passage 2312 toward the outside of the first part 211. As described above, various modified examples of the present exemplary embodiment are possible.

Hereinafter, a home port according to a comparative example will be described.

FIG. 9 is a view illustrating a home port according to a comparative example.

Referring to FIG. 9, in a home port 20 according to a comparative example, a manifold 20M may be installed on one side of a body 20H or below the body 20H. The manifold 20M is provided outside the body 20H, such that a space restriction occurs, and has a structure in which a plurality of hoses 20L are connected thereto, such that a problem such as tearing (or bending) of the hoses may occur.

On the other hand, the home port 200 according to an exemplary embodiment of the present disclosure has a structure in which the cleaning liquid is distributed inside the body 210, such that various effects such as improvement of space utilization and prevention of leakage of the cleaning liquid due to tearing of the hose may be created.

In some embodiments, the adjustment of the gap adjusting members 245 as well as the pressure adjusting members 243 may be controlled manually, or automatically using electromechanical control systems programmed according to a control program, which may be set by an operator. A method of manufacturing a semiconductor device using the apparatus 100 is described in FIG. 10, with reference to items described in FIGS. 1-9.

As can be seen in FIG. 10, in step 1010, a substrate W is placed on a support plate, such as support plate 121 of FIG.

1, which may be housed in a chamber. In step 1020, a nozzle moving member, such as nozzle moving member 150, moves a nozzle head 140 over the substrate W in the chamber. In step 1030, the nozzle head 140 is used to coat the substrate W, for example with a photoresist or developing liquid. During step 1030, certain nozzles (e.g., nozzles 141) may be used during the coating, and certain nozzles (e.g., nozzles 142) may not be used for the coating. In step 1032, the nozzle head 140 is moved, for example, by nozzle moving member 150, to home port 200. In step 1034, remaining treatment liquid is discharged from the nozzle head 140 into a discharge space in the home port 200, and a cleaning process is carried out on selected nozzles of the nozzle head 140 while in the home port 200. For example, as discussed in connection with FIG. 5 above, flexible sheet valves 235 corresponding to nozzles 141 may be controlled to be in an open position to discharge cleaning liquid toward nozzles 141, and flexible sheet valves 235 corresponding to nozzles 142 may be controlled to be in a closed position to prevent cleaning liquid from being discharged toward nozzles 142. Either before, at the same time as, or after steps 1032 and 1034, in step 1040, patterning of the photoresist and/or developing is performed, and in step 1050, additional processes are then carried out on the substrate W, such as etching, to form a pattern in the substrate W. These steps and further steps, such as deposition of additional layers and components in one or more additional chambers, may then be performed to result in fabrication of a semiconductor device, such as semiconductor memory chip or semiconductor logic chip.

The exemplary embodiments of the present disclosure have been described hereinabove with reference to the accompanying drawings, but it will be understood by one of ordinary skill in the art to which the present disclosure pertains that various modifications and alterations may be made without departing from the technical spirit or essential feature of the present disclosure. Therefore, it is to be understood that the exemplary embodiments described above are illustrative rather than being restrictive in all aspects.

It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

Different fluid passages discussed above and described in the claims, may be described in terms of being upstream or downstream, for example, between a source and an outlet, and in reference to a direction in which the fluid is designed to flow.

What is claimed is:

1. A home port for a semiconductor manufacturing nozzle head, the home port comprising:

a body having a discharge space configured to receive a treatment liquid discharged from a plurality of nozzles;

discharge flow passages connected to be in communication with the discharge space and penetrating through the body so as to face the plurality of nozzles; and a cleaning liquid distribution system formed to penetrate through the body, and configured to transfer a cleaning liquid to the discharge flow passages, wherein the cleaning liquid distribution system includes:

supply flow passages configured to supply the cleaning liquid to the discharge flow passages;

a lead-in passage connected to the supply flow passages and configured to receive the cleaning liquid from an outside of the body, wherein the body includes a first part configured to receive the plurality of nozzles and a second part coupled below the first part to form the discharge space, wherein the discharge flow passages penetrate through the first part such that inlets thereof are formed at an outer side of the first part, wherein valves are provided to cover the inlets of the discharge flow passages and define adjustment spaces between each of the valves and the first part, and wherein the home port further comprises a controller configured to control each of the valves such that each of the adjustment spaces are selectively expanded or contracted to allow or block communication between the supply flow passages and the discharge flow passages.

2. The home port of claim 1, wherein the body includes:

the first part in which the plurality of nozzles are positioned; and the second part coupled below the first part to form the discharge space configured to receive the treatment liquid.

3. The home port of claim 2, wherein the discharge flow passages connect between the inlets thereof and outlets thereof, which outlets face the discharge space.

4. The home port of claim 3, wherein the valves are provided as diaphragms.

5. The home port of claim 3, wherein each supply flow passage includes a first flow passage penetrating through the first part of the body and having one end exposed to an outside of the first part of the body, and a second flow passage communicating with the first flow passage, penetrating through the second part of the body, and connected to the lead-in passage, and wherein each valve of the valves covers an inlet of a corresponding discharge flow passage and one end of a corresponding first flow passage such that the adjustment spaces allow the discharge flow passages and the first flow passages to communicate with each other outside the first part of the body.

6. The home port of claim 5, wherein each first flow passage faces a corresponding second flow passage such that a straight section extending in a vertical direction is formed.

7. The home port of claim 6, further comprising a first O-ring surrounding the straight section of each first flow passage between the first part of the body and the second part of the body.

8. The home port of claim 5, wherein the controller comprises:

a housing having an operating space formed to be partitioned from the adjustment spaces while surrounding the valves on a side opposite to the adjustment spaces; and one or more pressure adjusting lines configured to form a vacuum environment in the operating space or make a pressure of the operating space equal to or higher than that of the discharge space, wherein, for each valve of the valves, when the vacuum environment is formed in the operating space, a pressure is applied to the valve in a direction from the discharge space toward the operating space such that a corresponding adjustment space is expanded and a corresponding discharge flow passage communicates with a corresponding first flow passage, and wherein, for each valve of the valves, when the pressure of the operating space is equal to or higher than that of the discharge space, the valve is restored, by the pressure applied in a direction from the operating space toward the discharge space such that the valve abuts the first part of the body to block communication between the corresponding discharge flow passage and the corresponding first flow passage.

9. The home port of claim 8, wherein the one or more pressure adjusting lines include a vacuum line configured to form the vacuum environment in the operating space.

10. The home port of claim 9, wherein the one or more pressure adjusting lines further include an air supply line configured to supply air to the operating space.

11. The home port of claim 8, wherein the housing includes through holes having inner circumferential surfaces on which screw threads are formed, and the controller further includes gap adjusting members each having a rod shape with screw threads formed on an outer circumferential surface thereof, the gap adjusting members penetrating through the through holes, being engaged with the screw threads of the housing, and configured to adjust distances between the gap adjusting members and the valves.

12. The home port of claim 11, wherein:

the plurality of nozzles include first nozzles and second nozzles, the numbers of the discharge flow passages, the supply flow passages, and the gap adjusting members correspond to a total number of the first nozzles and the second nozzles, more than one gap adjusting member corresponding to the first nozzles are spaced apart from the first part of the body to allow expansion of the adjustment spaces corresponding to positions of the first nozzles, and remaining gap adjusting members corresponding to the second nozzles are positioned such that the valves abut the first part of the body to block communication between corresponding supply flow passages and corresponding discharge flow passages.

13. The home port of claim 2, wherein:

the first part of the body is made of metal and has an inner circumferential surface facing the discharge space coated with a non conductive material, and the second part of the body is made of resin.

14. A substrate treatment apparatus, comprising:

a substrate support for supporting a substrate;

the semiconductor manufacturing nozzle head including the plurality of nozzles configured to discharge the treatment liquid; and the home port as claimed in claim 1.

15. The substrate treatment apparatus of claim 14, wherein each supply flow passage includes:

a first flow passage penetrating through the first part of the body and having one end exposed to the outside of the first part of the body; and a second flow passage communicating with the first flow passage, penetrating through the second part of the body, and joining the lead-in passage.

16. The substrate treatment apparatus of claim 15, wherein the home port further includes a controller including a housing and one or more pressure adjusting members, the housing having an operating space formed to be partitioned from the adjustment spaces while surrounding the valves on an opposite side to the adjustment spaces, and the one or more pressure adjusting members configured to form a vacuum environment in the operating space or make a pressure of the operating space equal to or higher than that of the discharge space, wherein for each valve, when the vacuum environment is formed in the operating space by a corresponding pressure adjusting member, a pressure is applied to the valve in a direction from the discharge space toward the operating space, such that the corresponding adjustment space is expanded and the inlet of the corresponding discharge flow passage and first flow passage communicate with each other, and wherein for each valve, when a pressure of the operating space is equal to or higher than that of the discharge space by a corresponding pressure adjusting member, the valve is restored, or when a pressure is applied to the valve in a direction from the operating space toward the discharge space, such that the valve abuts the first part of the body, the communication between the inlet of the discharge flow passage and the first flow passage is blocked.

17. The substrate treatment apparatus of claim 16, wherein:

the housing includes through holes having inner circumferential surfaces on which screw threads are formed, the controller further includes gap adjusting members penetrating through the through holes and engaged with the screw threads of the housing member, configured to adjust distances of the gap adjusting members to the valves according to a position of screw coupling, the nozzles include first nozzles and second nozzles, the numbers of discharge flow passages, supply flow passages, and gap adjusting members are the same as each other, and are the same as the sum of the number of first nozzles and the number of second nozzles, and the home port is configured such that in order for a plurality of discharge flow passages to discharge the cleaning liquid to the first nozzles, but not to discharge the cleaning liquid to the second nozzles:

some of a plurality of gap adjusting members are positioned to be spaced apart from the first part of the body so as to allow expansion of the adjustment spaces corresponding to positions of the first nozzles, and others of the plurality of gap adjusting members are positioned to cause the valves corresponding to positions of the second nozzles to abut the first part of the body.

18. The substrate treatment apparatus of claim 14, wherein:

the treatment liquid includes a photosensitive liquid, and the cleaning liquid includes a thinner.

19. The substrate treatment apparatus of claim 14, wherein each valve is provided as a diaphragm.

* * * * *